(12) United States Patent
Dunham

(10) Patent No.: US 6,626,998 B1
(45) Date of Patent: Sep. 30, 2003

(54) PLASMA GENERATOR ASSEMBLY FOR USE IN CVD AND PECVD PROCESSES

(75) Inventor: Scott William Dunham, Fremont, CA (US)

(73) Assignee: Genus, Inc., Sunnyvale, CA (US)

(*) Notice: Subject to any disclaimer, the term of this patent is extended or adjusted under 35 U.S.C. 154(b) by 157 days.

(21) Appl. No.: 09/709,228

(22) Filed: Nov. 8, 2000

Related U.S. Application Data (63) Continuation-in-part of application No. 09/350,417, filed on Jul. 8, 1999, now Pat. No. 6,206,972.

(51) Int. Cl.[7] .............................................. C23C 16/00
(52) U.S. Cl. ..................... 118/723; 118/715; 118/723 R
(58) Field of Search ............................. 118/715, 723 E, 118/723 R; 156/345.33, 345.34, 345.47, 345.43, 345.44, 345.45, 345.46

(56) References Cited

U.S. PATENT DOCUMENTS

| | | | | |
|---|---|---|---|---|
| 3,689,110 A | * | 9/1972 | Ferguson et al. | 285/15 |
| 4,226,164 A | * | 10/1980 | Carter | 411/433 |
| 4,923,349 A | * | 5/1990 | Logsdon | 411/433 |
| 5,000,113 A | * | 3/1991 | Wang et al. | 118/723 E |
| 5,466,106 A | * | 11/1995 | Bone et al. | 411/433 |
| 5,558,717 A | * | 9/1996 | Zhao et al. | 118/715 |
| 5,725,675 A | * | 3/1998 | Fong et al. | 118/723 E |
| 5,882,414 A | * | 3/1999 | Fong et al. | 118/723 R |
| 5,906,683 A | * | 5/1999 | Chen et al. | 118/724 |
| 5,968,276 A | * | 10/1999 | Lei et al. | 118/723 R |
| 6,096,564 A | * | 8/2000 | Denes et al. | 438/1 |
| 6,110,556 A | * | 8/2000 | Bang et al. | 428/64.1 |
| 6,161,500 A | * | 12/2000 | Kopacz et al. | 118/723 E |
| 6,379,466 B1 | * | 4/2002 | Sahin et al. | 118/724 |

* cited by examiner

Primary Examiner—Luz L. Alejandro
Assistant Examiner—Michelle Crowell
(74) Attorney, Agent, or Firm—Donald R. Boys; Central Coast Patent Agency, Inc.

(57) ABSTRACT

An RF electrode module for use with a gas-diffuser showerhead device in a CVD chamber has an electrically-conductive electrode ring with a ring, inside diameter (R-ID) and a ring outside diameter (R-OD). The ring has an upwardly-extending power post, and an internal water-cooling channel open to an upwardly extending inlet tube and an upwardly-extending outlet tube, the post and tubes parallel to a central axis of the ring. There is further an electrical-insulator ring having an insulator outside diameter (I-OD) equal to or greater than the R-OD and an insulator inside diameter (I-ID) equal to or smaller than the R-ID, and through-openings extending in the direction of the central axis of the ring and spaced such that the power post, inlet tube, and outlet tube extend through the through-openings in the insulator ring. In a preferred embodiment the I-ID is sized to engage a shoulder diameter of the gas diffuser showerhead device. The disclosure also teaches a split nut for providing a secure and removable connection of a fluid-supply apparatus to a tube in a manner to withstand substantial internal fluid pressure.

4 Claims, 9 Drawing Sheets

PLASMA GENERATOR ASSEMBLY FOR USE IN CVD AND PECVD PROCESSES

CROSS-REFERENCE TO RELATED DOCUMENTS

The present invention is a continuation in part (CIP) to copending patent application entitled "Method and Apparatus for Providing Zone Specific and Multi-Zone Gas Applications to Targets in CVD and PECVD Processes", bearing Ser. No. 09/350,417, filed Jul. 8, 1999, U.S. Pat. No. 6,206,972 which is incorporated herein in its entirety by reference.

FIELD OF THE INVENTION

The present invention is in the field of thin-film deposition, such as Chemical Vapor Deposition (CVD) and Plasma Enhanced Chemical Vapor Deposition (PECVD) for semiconductor manufacture, and pertains more particularly to methods and apparatus for generating and maintaining a uniformly-charged plasma in a reactor without requiring extensive metal-from-metal insulation.

BACKGROUND OF THE INVENTION

In the field of Thin Film Technology, used extensively in manufacture of integrated circuits, requirements for thinner deposition layers, better uniformity over larger surfaces, and larger production yields have been, and are, driving forces behind emerging technologies developed by equipment manufactures. As semiconductor devices become smaller and faster, the need for greater uniformity and process control of film properties such as layer thickness, uniformity, and the like rises dramatically.

Various technologies are well known in the art for applying thin films to substrates in manufacturing steps for integrated circuits (ICs). Among the more established technologies available for applying thin films is Chemical Vapor Deposition (CVD), which includes Plasma Enhanced Chemical Vapor Deposition (PECVD). These are flux-dependent applications requiring specific and uniform substrate temperature and precursors (chemical species) to be in a state of uniformity in the process chamber in order to produce a desired film of uniform thickness on a substrate surface. These requirements become more critical as substrate size and device size increases, creating a need for more complexity in chamber design and gas flow techniques to maintain adequate uniformity.

CVD systems use a variety of known apparatus for delivering precursor gases to target substrates. Generally speaking, gas delivery schemes for CVD and PECVD processes are designed specifically for one particular application and substrate size. Therefore variations in theme of such delivery apparatus and methods will depend on the particular process parameters and size of substrates being processed in a single reactor. Prior art gas manifolds and diffusers have been manufactured from a variety of materials and are widely varied in design. For example, some gas delivery manifolds are long tubes that are either straight or helical with a plurality of small, often differently sized, gas delivery holes spaced longitudinally along the manifold. Most diffusers and showerheads are basically baffle-type structures having a plurality of holes placed in circular or spiral type arrangements on opposite facing plates or surfaces. Often the holes are contained in a series of expanding radii circles on each plate. Often such apparatus is adapted only for one type of process and cannot be used with other processes using the same CVD equipment.

One characteristic that is generally required in CVD gas delivery apparatus is that hole sizes and spacing between the holes is strictly controlled such that a uniform gas distribution or zone is maintained over a particular surface area. Uneven gas flow often results if some holes are inadvertently made too large in comparison with a mean size, or placed in wrong positions. If a larger substrate is used in a same or different chamber, then the gas delivery apparatus must often be exchanged for one that is designed and adapted for the variance in substrate size and/or chamber parameters. Improvements made to manifold and diffuser designs depend largely on empirical methods in the field resulting in numerous cases of product expenditure through batch testing.

One problem with many diffusing showerhead systems relates to limited gas flow dynamics and control capability. For example, gas delivered through a typical showerhead covers a diffusion zone inside the chamber that is produced by the array of diffusion holes placed in the showerhead. If a system is designed for processing a 200-mm wafer or wafer batch, the gas diffusion apparatus associated with that system will produce a zone that is optimum for that size. If the wafer size is increased or reduced beyond the fixed zone capability of a particular showerhead, then a new diffusion apparatus must be provided to accommodate the new size. There are typically no conventions for providing more than a few zones or for alternating precursor delivery for differing size substrates in one process.

In an environment wherein different sizes of substrates are commonly processed, it is desired that diffusing methods and apparatus be more flexible such that multi-zone diffusing on differing size substrates is practical using one showerhead system. This would allow for less downtime associated with swapping equipment for varying situations, and better uniformity by combining and alternating different zones during diffusion.

A gas diffusing system known to the inventor provides multi-zone (target zone) gas diffusing capability for CVD and PECVD systems. Zone-independent gas-supply lines integrated with the system allow process operators to adjust gas flow to each created target zone. A plurality of physical gas zones provided and contained in the diffuser assembly may be used alternately, in unison, or in specific combinations such that deposition uniformity is enhanced and may be fine-tuned during process.

The multi-zone diffuser known to the inventor uses an upper diffusing component, a gas transition component, and a lower diffusion component. All three components cooperate to provide a uniform layering capability that is consistent from process to process and batch to batch. The diffuser also is flexible to variances in substrate size by virtue of adding or subtracting physical gas zones in the diffuser thereby affecting target zones in the reactor.

As described above, PECVD has certain advantages over stock CVD applications because of a higher reactive state of precursor, which is charged by an RF plasma electrode. In standard CVD, plasma is sometimes used, not as a precursor, but for enhanced cleaning operations between deposition processes.

In PECVD, it is desired that a constant uniform state of charged plasma be maintained for enhancing reactivity for deposition and, of course, chamber cleaning. As with gas introduction, it is important that plasma is uniformly generated for the purpose of providing a uniform precursor reaction. If plasma is not uniform in generation than precursor will not react uniformly over a target, and may act to actually disturb otherwise uniform layering. In generating the plasma, it is desired that bombardment of precursor be directed in an effective manner to enhance uniformity.

In prior art applications the diffuser assembly or showerhead itself is used as the electrode for plasma charging and RF power is applied directly. This method requires extensive insulation steps in order to isolate the desired component acting as the electrode from the rest of an assembly. Also, typical gas diffusion apparatus has have large cavities to allow the gas to diffuse, and these areas can be susceptible to striking a plasma which is undesirable.

As a result of the above, insulating components, such as rings, plates and so on must be placed between metal components. Moreover, the component acting as the RF electrode is, most often, not physically designed to optimize plasma generation in the chamber.

What is clearly needed is a modular apparatus and method for generating and maintaining a uniform charged plasma in a PECVD or CVD process that requires minimum metal-from-metal insulation procedures. Such a system would enhance uniform plasma reactivity in process and facilitate expeditious maintenance operations between processes.

SUMMARY OF THE INVENTION

In a preferred embodiment of the present invention an RF electrode module for use with a gas-diffuser showerhead device in a CVD chamber is provided, comprising an electrically-conductive electrode ring with a ring inside diameter (R-ID) and a ring outside diameter (R-OD), the ring having an upwardly-extending power post, and an internal water-cooling channel open to an upwardly extending inlet tube and an upwardly-extending outlet tube, all posts and tubes parallel to a central axis of the ring; and an electrical-insulator ring having an insulator outside diameter (I-OD) equal to or greater than the R-OD and an insulator inside diameter (I-ID) equal to or smaller than the R-ID, and through-openings extending in the direction of the central axis of the ring and spaced such that the power post, inlet tube, and outlet tube extend through the through-openings in the insulator ring, the I-ID sized to engage a shoulder diameter of the gas diffuser showerhead device.

In a preferred embodiment electrode module has an angled face from the R-OD to the R-ID, facing toward the central axis of the electrode ring, and the electrical-insulator ring has a groove enclosing the electrode ring leaving only the angled face exposed. Also in a preferred embodiment the inlet post and the outlet post each comprise a groove in the outer tube diameter adjacent an end away from the electrode ring, the grooves for matching flexible extensions of split, threaded nuts capable of slipping over the end of the tubes such that the flexible extensions engage the grooves in the tubes.

In another aspect of the invention a split, threaded nut for engaging, a tube to connect a fluid supply is provided, the nut comprising a substantially cylindrical body having an outside major diameter and a through-bore along a central axis of the body, the through-bore defining an inside major diameter, the body having a length in the direction of the central axis, a tool interface at a first end of the body, the tool interface shaped to engage a tool for exerting a torque around the central axis, a threaded region along the outside major diameter from a second end of the body opposite the first end and extending from the second end along a substantial portion of the outside major diameter toward the tool interface, an internal ridge in the substantially cylindrical body extending from the inside major diameter toward the central axis for a portion of the length within the threaded region; and three or more flexible portions formed by cuts through the substantially cylindrical body from the second end extending for a substantial portion of the threaded region.

In some embodiments of the invention the internal ridge is in a trapezoidal shape, which provides surfaces in the transverse direction of the tube to absorb forces from internal fluid pressure.

In another aspect the electrode module further comprises a threaded nut assembled to each inlet and outlet tube, and each threaded nut has a substantially cylindrical body having an outside major diameter and a through-bore along a central axis of the body, the through-bore defining an inside major diameter, the body having a length in the direction of the central axis, a tool interface at a first end of the body, the tool interface shaped to engage a tool for exerting a torque around the central axis; a threaded region along the outside major diameter from a second end of the body opposite the first end and extending from the second end along a substantial portion of the outside major diameter toward the tool interface; an internal ridge in the substantially cylindrical body extending from the inside major diameter toward the central axis for a portion of the length within the threaded region; and three or more flexible portions formed by cuts through the substantially cylindrical body from the second end extending for a substantial portion of the threaded region. The threaded nut on each inlet and outlet tube engages the groove in the outer tube diameter by the internal ridge in the substantially cylindrical body of the threaded nut.

In yet another aspect a connector system for connecting a fluid supply apparatus to a tube having an external groove adjacent an open end, such that the fluid supply apparatus will remain in place against substantial internal fluid pressure is provided, comprising a nut having a bore and a length, an internal ridge in the bore orthogonal to the bore, an external thread over a portion of the length, and plural flexible regions formed by splitting the nut along a portion of the length, and an internally threaded connector hermetically joined to the fluid supply apparatus. The flexible portions, by flexing outwardly, allow the nut to be engaged over the tube and moved in the direction of the bore until the internal ridge engages the external groove in the tube, and wherein threading the external thread of the nut into the internally-threaded connector joins the tube to the fluid supply apparatus and constrains the flexible portions to hold the internal ridge in the tube groove such that the nut may not move along the tube.

In still another aspect method for attaching a fluid supply apparatus to an open-ended tube in a manner to retain the fluid-supply apparatus in place on the tube against substantial fluid pressure is provided, comprising steps of (a) forming a groove in the outer diameter of the tube adjacent the open end, (b) engaging a nut having a bore and a length, an internal ridge in the bore orthogonal to the bore direction, an external thread over a portion of the length, and plural flexible regions formed by splitting the nut along a portion of the length over the tube, until the internal ridge engages the groove in the tube; and (c) threading the external thread of the nut into an internal thread of a connector joined hermetically to the fluid-supply apparatus, thereby constraining the flexible regions such that the nut may not move along the tube.

For the first time, with this invention, in individual ones of several embodiments taught in enabling detail below, a separate internal electrode for establishing a plasma in a CVD chamber is provided to be used, if needed, with a gas diffusion showerhead apparatus, and a means of assembling the electrode mechanism to a chamber from inside the chamber, while providing a secure, yet removable connection for fluid feed tubes to the electrode is also provided.

DESCRIPTION OF THE PREFERRED EMBODIMENTS

As described in the background section, obtaining consistent and uniform material layering in semiconductor manufacturing is paramount to producing high quality semiconductor devices. However, there are many limitations inherent to prior-art diffusing apparatus that continue to plague manufacturers using CVD or CVD-variant applications. The inventor provides in this disclosure a unique apparatus and method for enhancing process uniformity by utilizing multi-zone capabilities and strictly controlled gas delivery methods. The method and apparatus of the present invention is described in enabling detail below.

Figure 1:
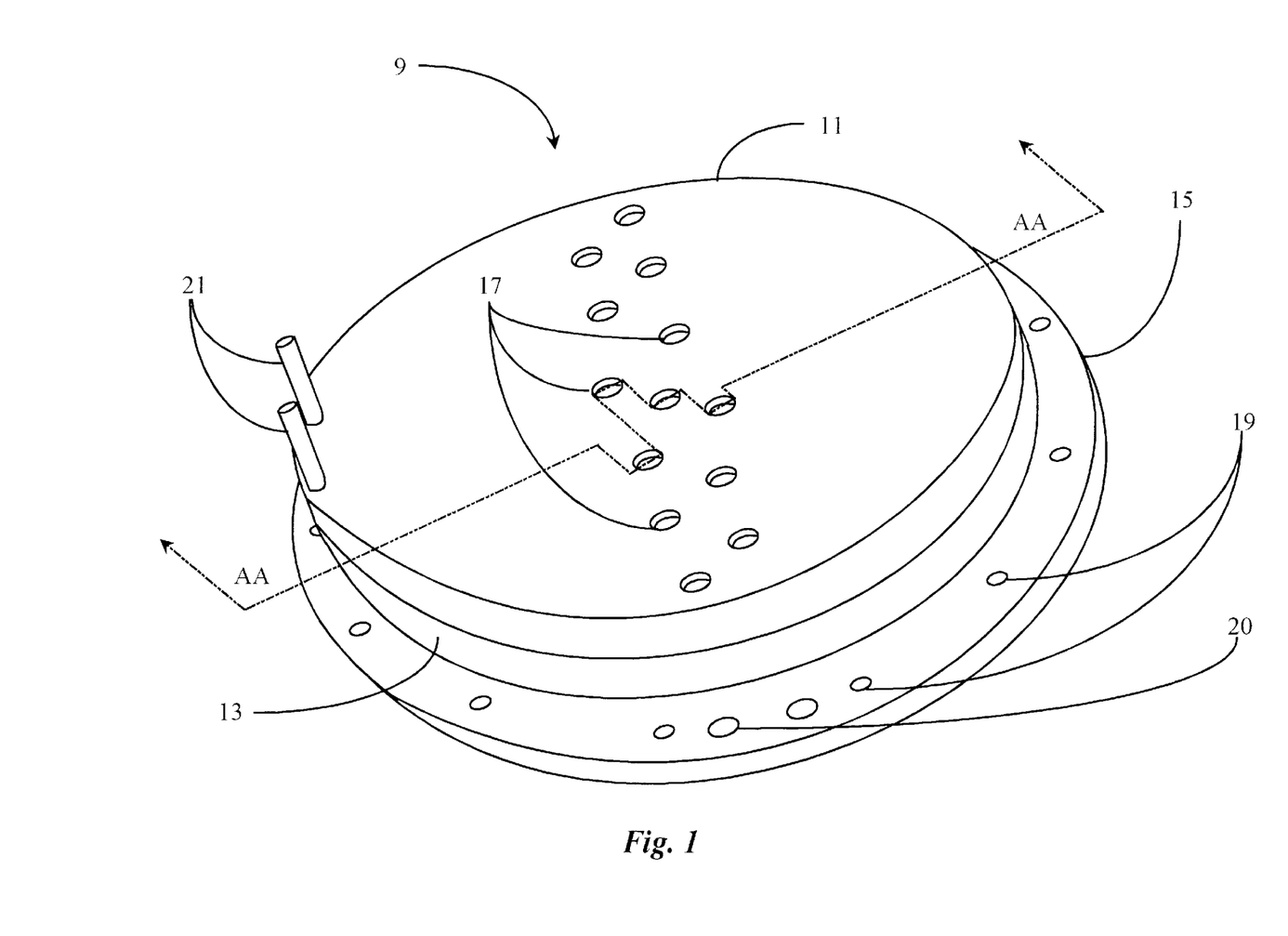
FIG. 1 is an isometric view of a multi-zone diffuser according to an embodiment of the present invention.

FIG. 1 is an isometric view of a multi-zone diffuser 9 according to an embodiment of the present invention. Diffuser 9 is adapted for delivering gas precursors and inert gases for the purpose of depositing films in CVD or CVD-variant processes.

Diffuser 9 is an assembly comprising in this embodiment three basic components, being an upper diffusion channel assembly 11, a gas transition baffle-plate 13, and a lower diffusion channel assembly 15. Components 11, 13, and 15 are, in a preferred embodiment, rigidly integrated into a whole by brazing or other joining method.

Diffuser 9 is designed and adapted to be fitted by a flange and suitable sealing elements to a process reactor (not shown) for the purpose of dispensing process gasses over a suitable substrate within. In one preferred embodiment Diffuser 9 engages through a lid of a single-wafer processing system. A lower portion (not visible in this view) of channel assembly 15 extends into a reactor when diffuser 9 is properly mounted. A plurality of through holes 19 on the flange portion of lower coil-assembly 15 are for bolts used in mounting to a lid of a reactor chamber, and holes 20 are provided for mounting an RF electrode in an alternative embodiment within a reactor for striking and maintaining plasma if required (PECVD and CVD clean).

Diffuser 9, by virtue of the above-described components, allows metered supply of gases to CVD or CVD-variant processes according to pre-calculated parameters. The features of diffuser 9 are designed to produce multiple radial gas-zones over a target in order to achieve enhanced uniformity controllability in layer deposition that has not previously been achieved with prior-art systems. Diffuser 9 further provides an ability to supply a wide variety of gases in metered fashion to some or all of the defined gas zones either alternately or in combination. This unique capability allows manufacturers to easily fine-tune layer uniformity in process to achieve optimum and repeatable layer uniformity over simple and complex topologies.

Upper coil-assembly 9 has a plurality of gas-supply passages 17 passing through an upper plate-surface. Each supply passage 17 feeds to one of multiple gas zones defined by a plurality of radial channels provided within assembly 11, shown in further Figs. Gas supply tubes and fittings adapted to conduct gases to passages 17 are not shown here for simplicity. Coolant delivery tubes 21 (an inlet and an outlet) are provided on the upper surface of coil-assembly 11 and are adapted to allow coolant to circulate through coolant channels in diffuser 9. More detail about diffuser 9 and internal components is provided below.

Figure 2:
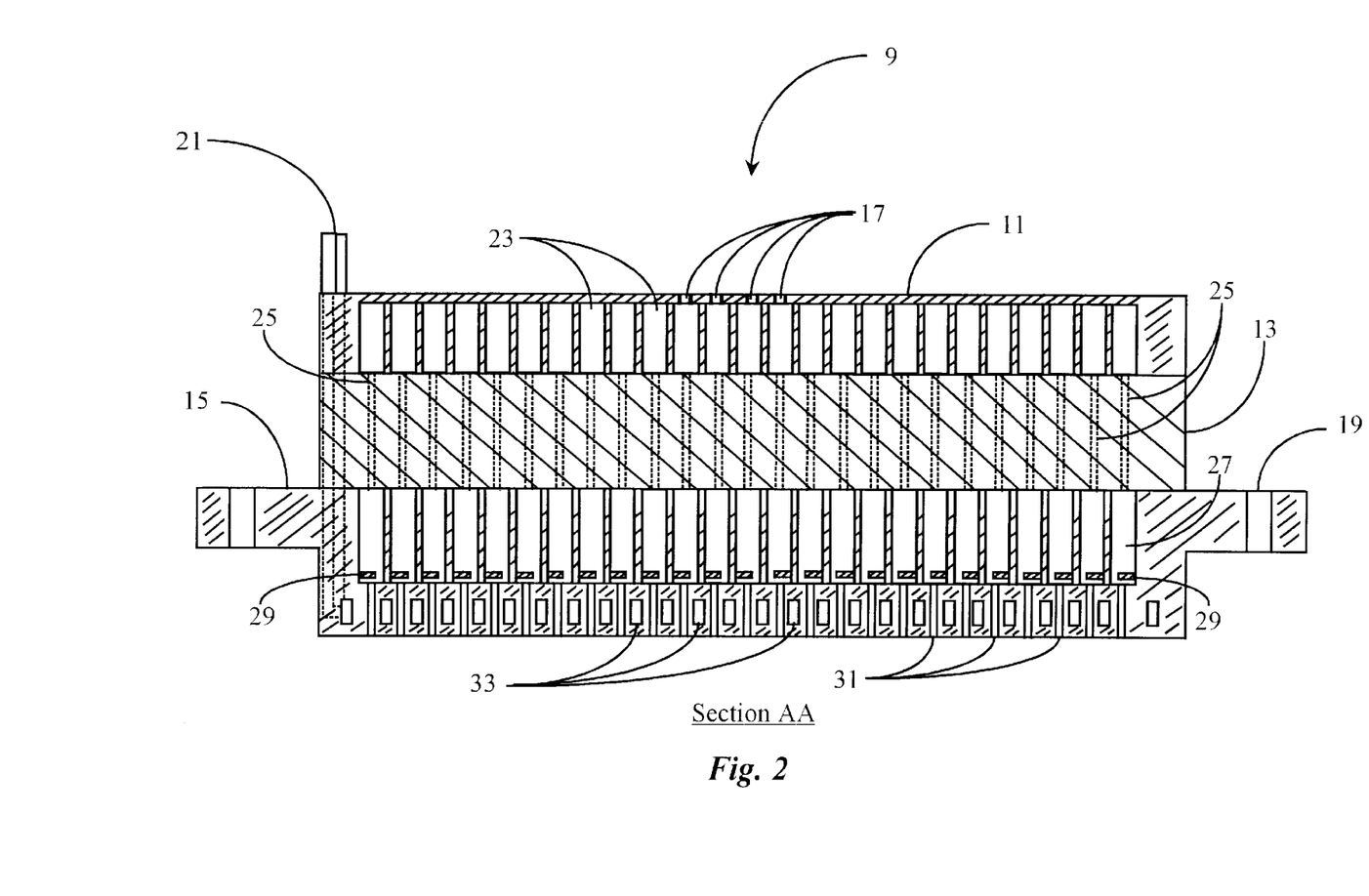
FIG. 2 is a section view of the multi-zone diffuser of FIG. 1 taken along the section lines AA illustrating three integral components.

FIG. 2 is a section view of diffuser 9 of FIG. 1 taken along the section line AA. Upper channel assembly 11 has a plurality of radial gas zones that are of differing diameters and are positioned in spaced concentric fashion. In this example, there are a total of thirteen zones 23, however there may be more or fewer zones 23 without departing from the spirit and scope of the present invention.

Each zone 23 is an independent circular channel, and is supplied by one gas supply passage 17, four of which are shown in this section view. By this arrangement different gases may be supplied to different gas zones 23 independently with no gas mixing or cross talk from one zone to another. Moreover, because there is no cross talk between individual zones 23, differing flow pressures may be applied to each specific zone. For example, a low metered flow may be provided to a channel closer to the center of the diffuser while a higher metered flow may be applied to a zone closer to the outer periphery. In addition, zones 23 may be used in alternate fashion. For example, by selectively shutting off gas supply to any one or a combination of gas supply passages 17, associated zones 23 may be shut off without affecting gas flow to other zones. This allows process operators much more flexibility when introducing separate gases into a process.

Lower channel assembly 15 has concentric channels in the same radial geometry as upper channel assembly 11, and baffle plate 13, which forms a center portion of diffuser 9, has a plurality of elongated gas transition passages 25 strategically placed therethrough, feeding gas from each upper channel to a corresponding lower channel. Baffle plate 13 is preferably manufactured of one solid metal piece. There may be any number and spacing of transition passages 25 through baffle element 13 for each pair of upper and lower channels without departing from the spirit and scope of the present invention. For example, an outer channel pair may have many more transition passages than in inner channel pair.

Transition passages 25 are significantly elongated by virtue of the thickness of plate 13 and substantially smaller in diameter than supply passages 17. Transition passages 25 may, as in this example, all be of the same diameter, or may be of differing diameters such as may be determined to effect specific desired gas flow characteristics. In addition to the length and diameter of transition passages 25, zone specific orientation of and number of holes 25 per zone may vary according to calculated determinates, which may be obtained through computer modeling, and are intended to produce optimum uniformity characteristics. These calculated determinates also determine the thickness of baffle assembly 13, thus defining the length of passages 25.

Channels 27 in assembly 15 are in this embodiment somewhat deeper (height) than channels 23 of assembly 11. This feature aids in further diffusing of gasses before they are passed into a reactor. A plurality of gas diffusion passages 31 are provided through a lower portion of channel assembly 15 into a reactor. Passages 31 are for allowing gases to pass from channels 27 into the reactor. The gases passing through passages 31 into the reactor are optimally distributed according to pre-determined parameters. The number of gas diffusion passages 31 per channel is typically substantially greater in embodiments of the invention than the number of gas transition passages 25 per channel. For example, an outer-most channel 27 may have three transition passages 25 (inlet to channel) and, perhaps 30 diffusion passages 31 (outlet from channel).

In embodiments of the invention an RF barrier ring 29 is provided one for each channel 27. RF rings 29 are designed and adapted to baffle the passages from channels 27 into the reactor chamber in a manner that a plasma struck in the chamber will not migrate into channels 27 of diffuser 9. RF rings 29 are made of a suitable electrically-conductive metal, and each RF ring 29 is preferably welded in each channel 27 just above the bottom surface of the channel, leaving space on the sides as shown, so gases passing from each channel 27 into a passage 31 must traverse a convoluted path of dimensions small enough to quench any plasma. In practice rings 29 are formed with three or more dimples facing downward at positions not aligned with passages 31, the rings are positioned with the bottom surface of these dimples touching the bottom of the respective channels, and the rings are then spot welded in the bottom of the channels.

Water passages 33 are provided in the walls separating channels 27 in channel assembly 15 allowing water cooling especially at the surface facing into the reactor chamber, as substrates to be processed are typically heated to a high temperature on a hearth in the chamber. Tubes 21 provide an inlet and outlet for coolant as previously described It will be apparent to one with skill in the art that diffuser 9 may be manufactured in many different diameters having different numbers of gas zones and channels without departing from the spirit and scope of the present Invention. In preferred embodiments, diffuser 9 is manufactured to accommodate a specific semiconductor wafer size, such as a 200 mm or 300 mm wafer. In practical application a diffuser made for one wafer size may be used for wafers of a smaller size by closing gas supply to outer channels and tuning gas supply to remaining channels.

It will also be apparent to one with skill in the art that a diffuser according to embodiments of the present invention may be manufactured according to dimensional determinates derived from computer modeling of gas flow dynamics. In this way, extensive field testing of uniformity characteristics normally required in prior-art process applications can be avoided. However, fine-tuning uniformity characteristics such as by adjusting flow rates to specific gas zones, shutting down certain gas zones, and the like may be practiced during process by operators using diffuser 9.

Figure 3:
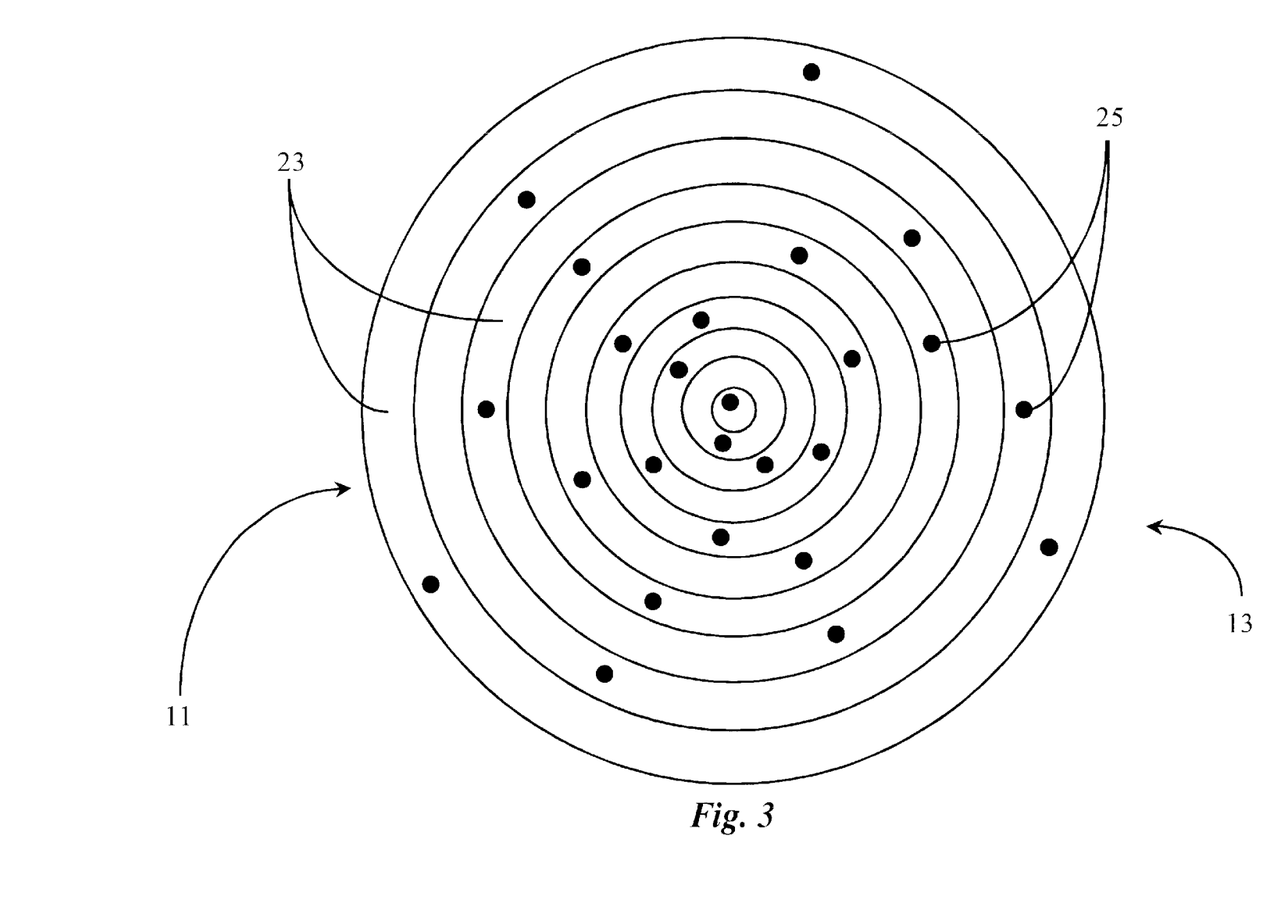
FIG. 3 is a block diagram illustrating upper gas zones and gas transition hole locations according to an embodiment of the present invention.

FIG. 3 is a diagram illustrating arrangement of upper gas channels 23 and exemplary locations of gas transition passages 25 according to an embodiment of the present invention. Channels 23 are in a concentric arrangement in relation to one another as previously described. Each channel 23 communicates with specific gas transition passages 25, which are machined through baffle-plate 13. For example, the centermost channel 23 has one gas transition passage 25. A third channel 23 (counting out from center) has two gas transition passages 25. Progressing toward the periphery, each successive channel thereafter has three gas transition passages 25. This specific arrangement in terms of number of passages 25 for each channel 23 is not to be construed as a limitation, but simply that centermost gas channels will typically require less gas flow than outer channels.

Transition passages 25 are, in this embodiment, arranged in an equally spaced formation (120-degree placement) with respect to each channel 23 having three passages per channel. Each formation of transition passages 25 has an offset orientation from passage locations in adjacent channels. This helps to facilitate even gas dispersal from upper channels 23 to lower channels 27, however, it is not required to practice the present invention. Computer modeling in different embodiments provides optimum data for quantity and positioning of transition passages 25 to facilitate optimum gas flow dynamics.

Diffuser 9 provides at least four degrees of freedom for facilitating graduated transition of gases from outer to inner gas channels. One option is regulating passage dimensions for transition passages 25 and by providing a constant number of passages 25 for each channel 23, with the passages for the channels closer to center having smaller passages and increasing the passage size (diameter) for passages in channels from channel to channel toward the outer diameter of the diffuser. Another option is to provide a constant number of transition passages per channel, but to regulate channel capacity by providing wider channels toward the center and narrower channels toward the outer diameter of the diffuser. Limiting the number of transition passages toward the center, as is shown here, is yet another option. Still another option is simply metering gas flow rates to each independent channel by virtue of channel-independent supply lines.

Figure 4:
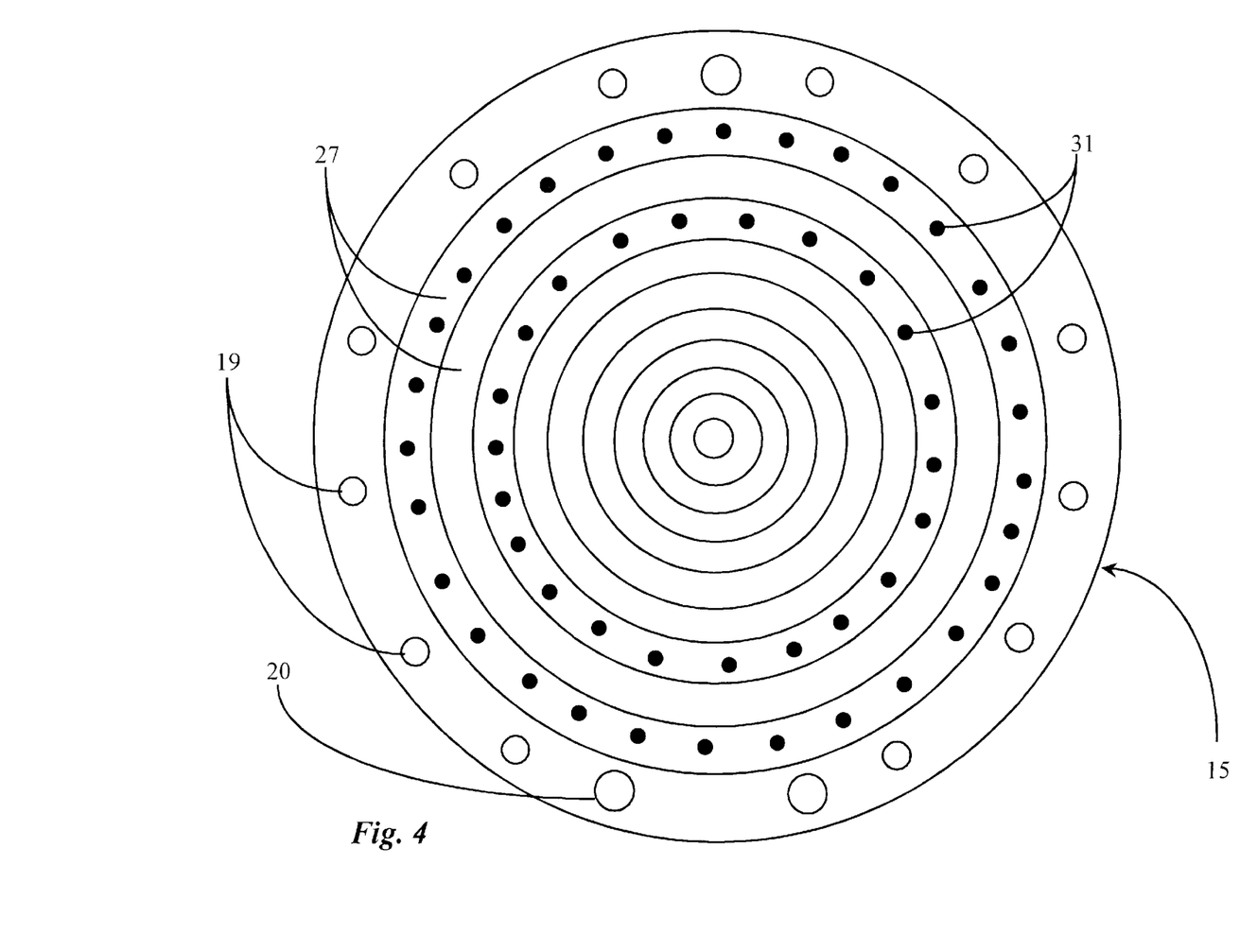
FIG. 4 is a block diagram illustrating lower gas zones and gas diffusion holes according to an embodiment of the present invention.

FIG. 4 is a diagram illustrating placement of gas diffusion passages in lower channel-assembly 15 according to an embodiment of the present invention. Each channel 27 has a plurality of equally spaced diffusion passages arranged in a circular pattern. Only two channels 27 are illustrated herein with diffusion passages 31 to avoid confusion, however, all zones may be assumed to have diffusion passages 31.

A marked difference between the arrangement of transition passages 25 as shown in FIG. 3 and diffusion passages 31 is that there are far more diffusion passages 31 than transition passages 25. In this embodiment, passages 31 are placed one about every 12 degrees or 30 holes 31 per channel 27. However the number of diffusion passages may be more or fewer, and the number per channel may vary as well.

The same flexibility regarding passage dimensions, channel width, channel combination or alternate use, quantity of passages, and so on is attributed to lower channel assembly 15 as was described above regarding baffle plate 13 and upper channel assembly 11. Gas flow through diffusion passages 33 in any one channel 27 may be adjusted by metering gas to independent gas supply lines entering diffuser 9. In most embodiments, diffusion passages 33 will be smaller than transfusion passages 25 and supply passages 17.

Figure 5:
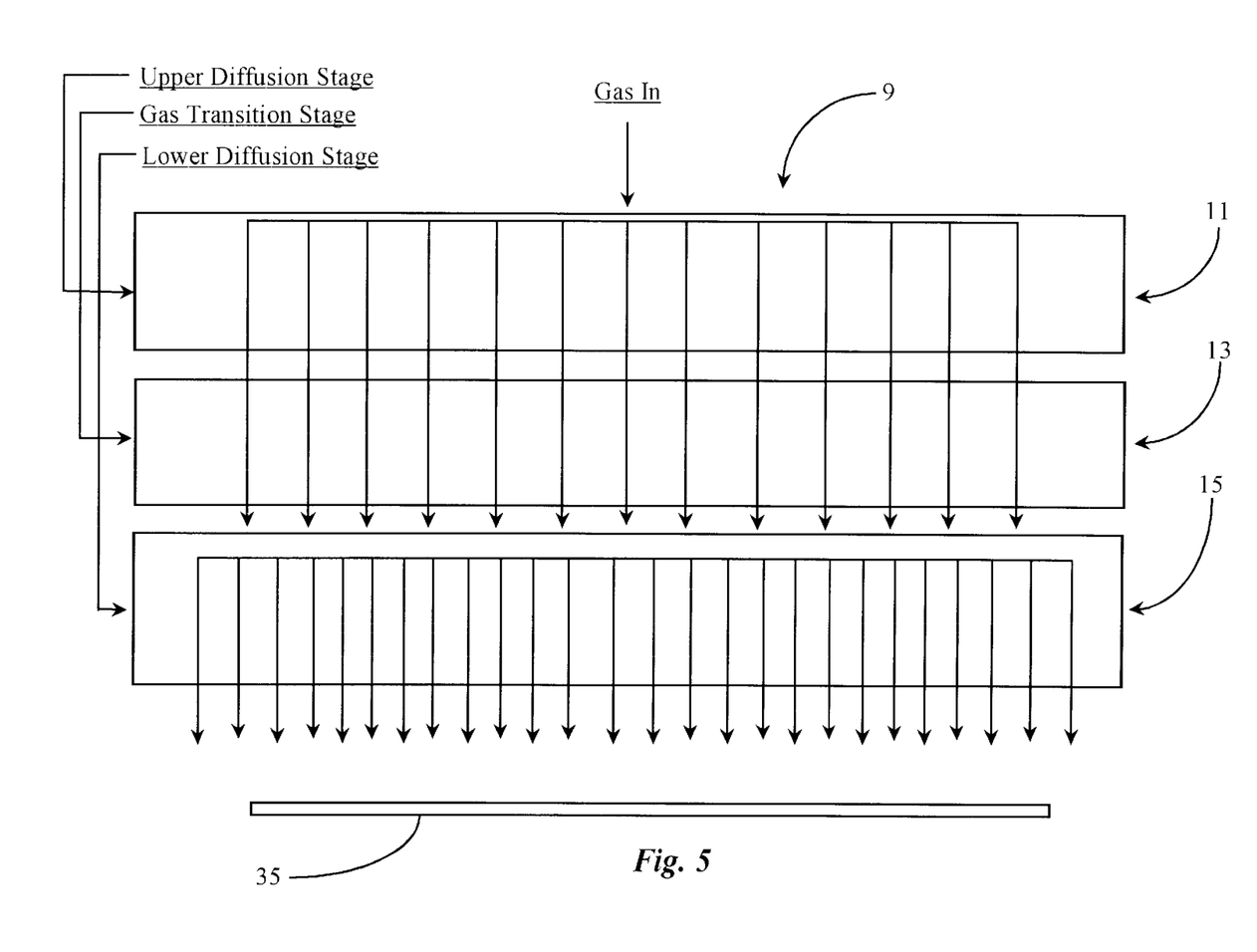
FIG. 5 is a block diagram illustrating three gas separation stages according to an embodiment of the present invention.

FIG. 5 is a diagram illustrating the three gas separation stages utilized by diffuser 9 according to an embodiment of the present invention. Diffuser 9, as previously described, has an upper diffusion stage provided by upper channel assembly 11. Gas is supplied to upper channel assembly 11 through zone-independent gas-supply lines 17, represented here by an arrow labeled Gas In. In the upper diffusion stage, gas is introduced and diffuses in channels 23 (FIG. 3) before passing through baffle-plate 13.

A gas transition stage is performed by baffle-plate 13 with transition passages 25. Gas in channels 23 is further diffused and directed as it passes through plate 13. A lower diffusion stage is performed in channel assembly 15. In the final stage the gases are further diffused as they pass through lower channel assembly 15. In a chamber, the introduced gases conform to multiple radial gas zones created therein by virtue of diffusion hole placement and positioning,. Also by virtue of the long and convoluted passages of gases into the reactor chamber, the gases finally enter the chamber without any sudden expansion or turbulence. In this way, a substrate may be uniformly interfaced to the gas flux facilitating uniform layer formation. Fine-tuning may be performed to further enhance uniformity by adjusting gas flow to separate channels, using some channels but not others, and so on.

It will be apparent to one with skill in the art that the method and apparatus of the present invention provides a unique enhancement and control for process operators not provided by prior art diffusing apparatus used in CVD processes. The provision of multiple but separate gas delivery channels over a target is a significant enhancement over the prior art.

It will further be apparent to a skilled artisan that because computer modeling of gas flow dynamics is performed to determine optimum parameters for dimensions of elements of diffuser 9, such parameters may be varied for different types of processes. Such parameters may also change due to different determinates derived from improved modeling techniques.

Modular Plasma Generation Assembly

In one aspect of the present invention, a method and apparatus is provided to enable RF plasma enhancement to CVD, or PECVD, that integrates with the above-described diffusing apparatus 9 of FIG. 1 such that a flux plasma may be generated and maintained for layer deposition and/or chamber cleaning purposes. Such method and apparatus will be described in enabling detail below.

Figure 6:
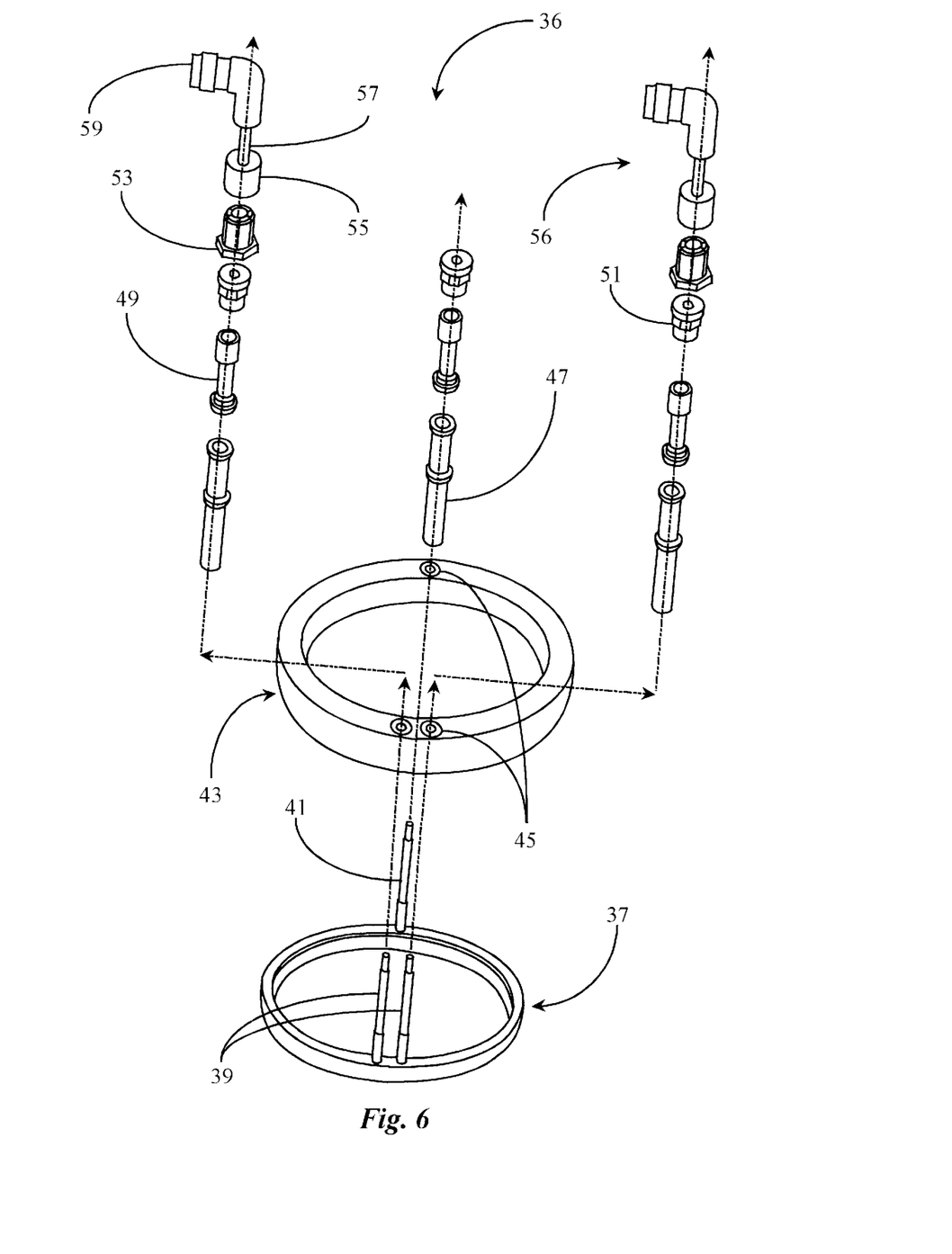
FIG. 6 is an exploded view of an RF electrode assembly usable with a diffuser according to an embodiment of the present invention.

FIG. 6 is an exploded view of an RF electrode assembly 36 according to an embodiment of the present invention. RF electrode assembly 36 is adapted to be integrated with diffuser 9 of FIG. 1 in a way that provides effective and directed plasma generation in a reaction chamber. Electrode assembly 36 is modular in the sense that it may be removed from and reinstalled, as a separate component-assembly, to a system using diffuser 9.

An RF electrode 37 is provided and adapted as a charging element used in generating the plasma during process. RF electrode 37 is a metallic ring and may be manufactured of any suitable metallic material that is conductive such as aluminum, steel, or the like.

RF electrode 37 is cooled by a liquid coolant and has two coolant supply/return posts 39 brazed or welded thereto, in a substantially upright position. Posts 39 are hollow and adapted for the purpose of circulating coolant by virtue of brazed or welded connection to a hollow channel provided inside the body of electrode 37. In one embodiment, a gas coolant may be substituted for liquid.

A solid RF power post 41 is provided and adapted to carry power to electrode 37. Power post 41 is brazed or welded to electrode 37 in similar fashion as are posts 39 described above. Posts 39 and post 41 are strategically located for assembly purposes. More specifically, they are adapted as positioned assembly-posts to which other required components are installed and assembled. Such required components include means for attaining vacuum seals for containing chamber vacuum and for retaining coolant as is detailed and described further below.

Electrode 37 is adapted to be fitted to diffuser 9 of FIG. 1 by virtue of post insertion (posts 39 and 41) through strategically placed openings such as openings 20 of FIG. 1, which are provided in the same geometric arrangement in the flanged area of lower channel-assembly 15 of diffuser 9 of FIG. 1. A chamber lid (not shown) fits over the flanged portion of the channel assembly 15 described above, and also has post openings for accommodating posts 39 and post 41. The chamber lid and diffuser 9 of FIG. 1 are not shown in this embodiment for reasons of clarity but may be assumed to be present.

An RF insulator ring 43 is provided and adapted to fit flush over electrode 37 before being fitted to the diffuser and chamber lid. Ring 43 is adapted to insulate the ringed portion of electrode 37 from lower channel assembly 15 (part of diffuser). Ring 43 may be manufactured of alumina or other insulating material. Three openings 45 are strategically provided through ring 43 and are adapted to accommodate posts 39 and post 41. Other required components are provided and installed to assembly 36 as indicated by arrows illustrating alignment of parts with post locations.

Three insulator feed-through components 47 (one for each post location) are provided and adapted to insulate posts 39 and post 41 from the bore walls of openings 20 (FIG. 1) in metallic components such as the previously-described lower-channel assembly and chamber lid. Feed-through components 47 each have two flanged portions formed thereon for sealing purposes. O-rings (not shown here) are provided to effect sealing. Feed through components 47, like ring 43 may be manufactured from alumna or other non-conductive material.

Three Ultratorr™ feed-through components 49 are provided and adapted to seat against feed-through components 47 forming, a vacuum seal by virtue of O-rings (not shown). A portion of each post 39 and 41 is machine threaded along a specified section. Internal threads machined inside each ultratorr 49 match the exterior threads located on each post thereby facilitating tightening of components 49 to feed through components 47 at the specified locations. Each component 49 holds it's associated assembly rigid to each post.

Three threaded caps 51 are provided (one for each component 49) and adapted-to be threaded over components 49. O-rings (not shown) inside each of caps 51 provide a second vacuum seal. Formed hex-heads on each of components 49 and threaded caps 51 provided accommodations for secure tightening with appropriate tools adapted for the purpose as is known in the art.

RF post 41 is, as previously described, a solid post and is a conduit from a power source to electrode 37. Post 41 requires no further components to be assembled thereon other than those already described with reference to all three posts. However, posts 39 are hollow tubes that supply coolant circulation through electrode 37, and require additional components to be assembled thereto as will be described below.

A split-thread collar 53 is provided and adapted to retain a brazed or welded coolant fitting-assembly 56 to posts 39. Assembly 56 comprises an elbow 59, a tube 57, and an elbow weldment 55. There is one split-thread collar 53 and coolant fitting-assembly 56 for each post 39. A novel aspect of the present invention is the ability of split-thread collar 53 to retain fitting-assembly 56 rigidly to post 39 under high pressure from coolant lines. An o-ring seal (not shown) placed inside component 55 provides a watertight seal between tube 57 and posts 39 (tubes). More detail about split-thread collar 53 will be provided below.

Figure 7:
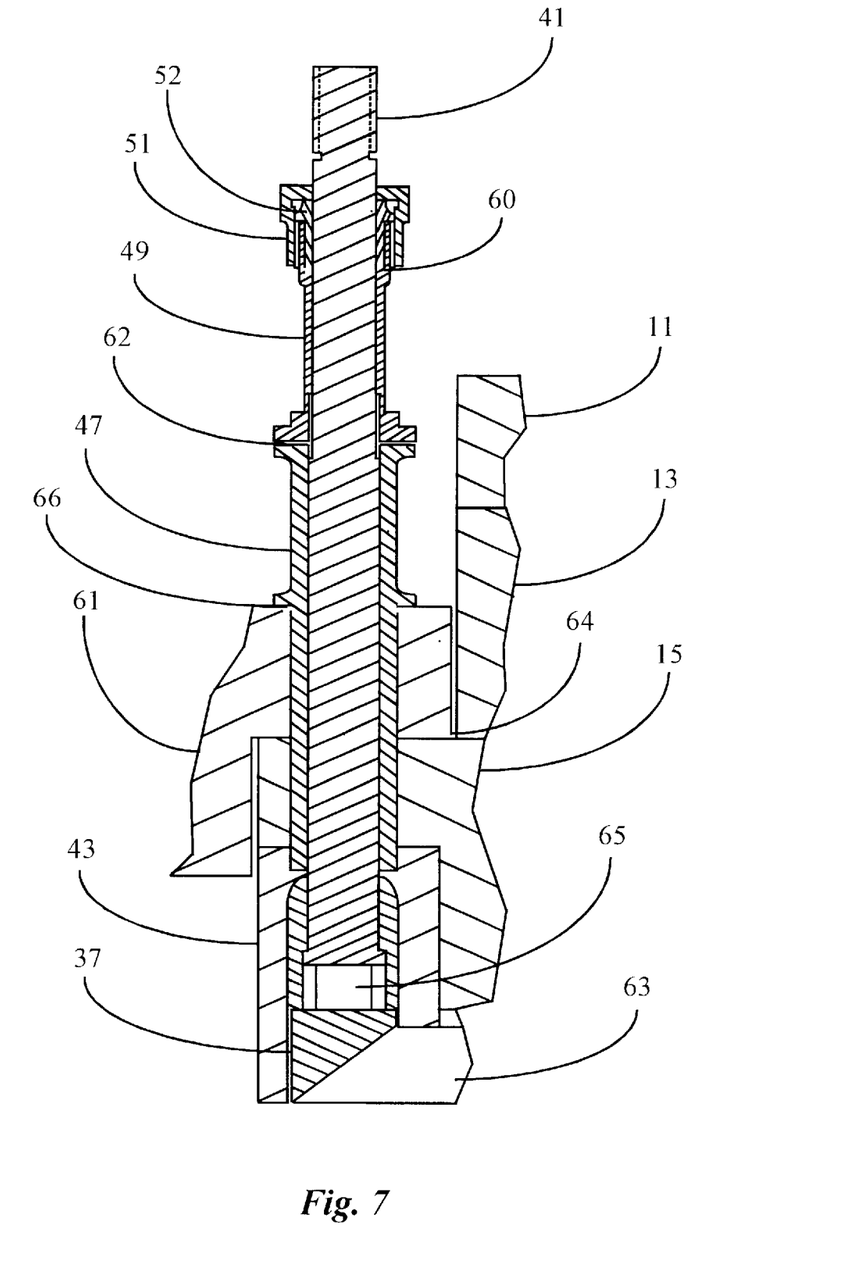
FIG. 7 is a partial section view of an assembled RF post portion of the RF assembly of FIG. 6.

FIG. 7 is a partial section view of an assembled RF post portion of RF assembly 36 of FIG. 6. In this embodiment RF post 41 is fully assembled and ready to be coupled to a power source. A power-source element may be threaded on to the top most portion of post 41 by virtue of machined threads as shown or by other known technique. In this example the top end of post 41 is illustrated as threaded (dotted lines).

A water channel 65 is provided inside electrode 37 and provides a circular path for coolant to travel. Posts 39 of FIG. 1 provide an inlet and outlet for coolant as previously described. Insulator ring 43 fits snugly around and over electrode 37 to provide insulation from lower channel-assembly 15 shown (broken) here and mounted flush against the upper surface of ring 43.

Electrode 37 has a large chamfer around it's inner bottom edge facing in the direction of an interior 63 of a chamber when assembled. The angle of the chamfer is approximately 45 decrees, but may be somewhat more or less than 45 degrees. The purpose of the chamfer is to enhance plasma position and shape in the chamber. In this example, the chamfer extends from the bottom outer edge of electrode 37 to just below water passage 65 breaking through the inner wall.

Feed-through 47 seats into ring 43 in a counter-bore recess provided for the purpose. A chamber lid 61 is mounted over assembly 15. An o-ring 64 provides a vacuum seal between lid 61 and channel assembly 15. Broken portions of upper channel assembly 11 and baffle-plate 13 are shown here as part of diffuser 9 of FIG. 1.

Feed-through insulator 47 has a lower flanged portion with an o-ring 66 installed for forming a vacuum seal against chamber lid 61. Insulator 47 has an upper flanged portion adapted to seat against a flanged portion of ultratorr 49. An o-ring 62 provides a vacuum seal between the two components. A threaded portion of post 41 provides a means for tightening ultratorr 49 down and drawing up electrode 37 thereby compressing o-rings 66 and 62 for vacuum purposes.

A second vacuum seal is achieved by virtue of an o-ring 60 placed inside an upper recess provided in the upper portion of ultratorr 49. Threaded cap 51 is threaded on to ultratorr 49 over an ultratorr adapter 52. Ultratorr adapter 52 fits into the above-described recess and has a surface interface to o-ring 60. By tightening threaded cap 51, o-ring 60 is compressed forming a second vacuum seal.

Coolant supply posts 39 support identical assembly components as described in this embodiment for RF post 41 save for coolant fitting apparatus 56 and split-thread collar 53 as previously described. Additional assembly requirements for posts 39 will be described below.

Figure 8:
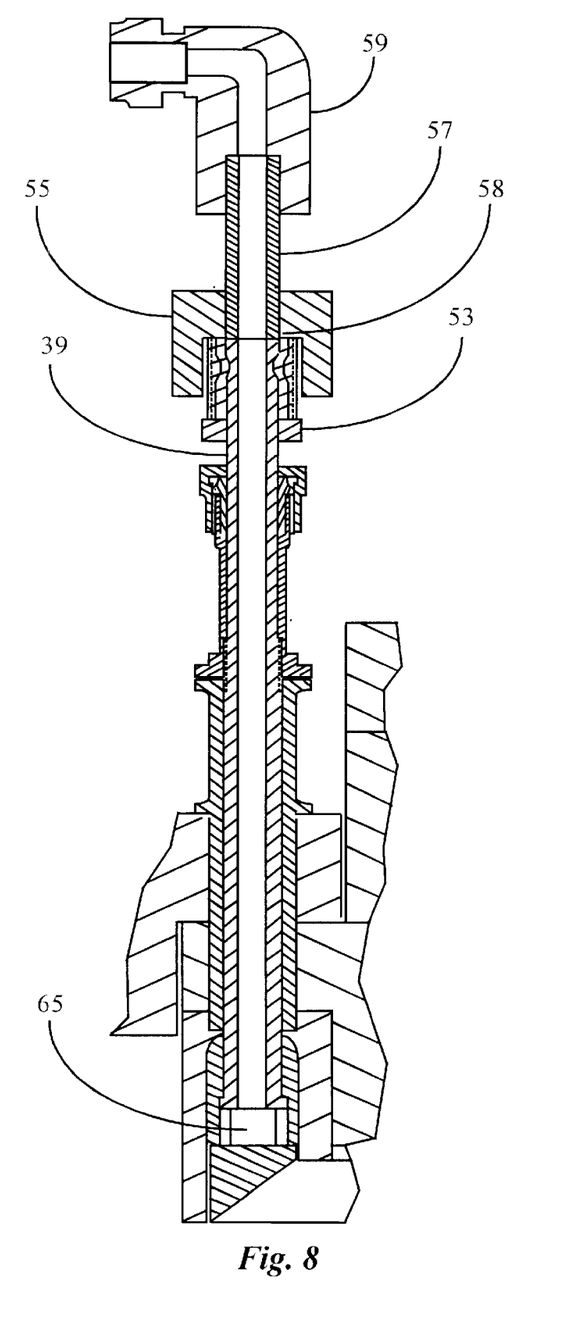
FIG. 8 is a partial section view of an assembled RF coolant-supply portion of the RF assembly of FIG. 6.

FIG. 8 is a partial section view of an assembled RF coolant-supply post 39 of the RF assembly 36 of FIG. 6. In this example, assembly requirements and components that are identical to those described in FIG. 6 are not re-introduced. Coolant assembly 56 comprising elbow 59, tube 57, and nut 55, is a brazed or welded component allowing coolant to be supplied to and returned from electrode 37.

Coolant is circulated in a forced manner at relatively high pressure. Split-thread collar 53, as previously described, provides a means for retaining assembly 56 to post 39 against the pressure of the coolant in operation. This is accomplished in a novel way by providing a groove around post 39 that is adapted to engage a matching ridge on split-thread collar 53. The collar may be assembled to the tube by a slight flexure of the separate regions of the collar formed by the splits (see FIG. 9 and description below). When nut 55 is engaged to collar 53 by threads provided, the separate regions of the collar can no longer flex, so the collar my not move along the tubing.

A ridge in the inner wall of collar 53 is formed to seat into the (groove formed around post 39. Collar 53 is machine threaded around it's outer surface and split through it's center such that six expandable land areas are formed. This allows the body of collar 53 to expand such that it may be de-seated from it's retaining groove around post 39. Elbow weldment 55 is threaded around a recess provided therein for the purpose of accepting the outer threaded area of collar 53. An o-ring 58 is provided inside the recess of weldment 55.

By turning collar 53 while it is retained in it's groove and started with the threads in weldment 55, coolant supply/return assembly 56 may be secured to post 39 with o-ring 58 providing a seal against water leakage. A solid seal-ring (not shown) is provided to interface between o-ring 58 and the top surface of collar 53 because of it's spilt nature. Collar 53 is prevented from expanding while threaded into weldment 55. This provides the rigid post assembly required for retaining assembly 56 under high pressure. By loosening collar 53 until it is no longer engaged to weldment 55, assembly 56 and collar 53 may be easily removed from post 39 facilitating assembly and disassembly requirements in the field that are related to cleaning, maintenance so on.

Because electrode 37 must be installed from below diffuser 9 of FIG. 1 and chamber lid 61 of FIG. 7, it is imperative that all components be removable for assembly and disassembly purposes. The unique nature of collar 53 provides a means wherein components may be retained in assembly under high pressure, but be easily removed when required.

Prior art systems wherein a diffuser or showerhead is used as the electrode require many insulator components in order to isolate the electrode portion away from other metallic components. Plasma assembly 36 requires only one ring 43 and three feed-through components 47 for insulating purposes.

Figure 9:
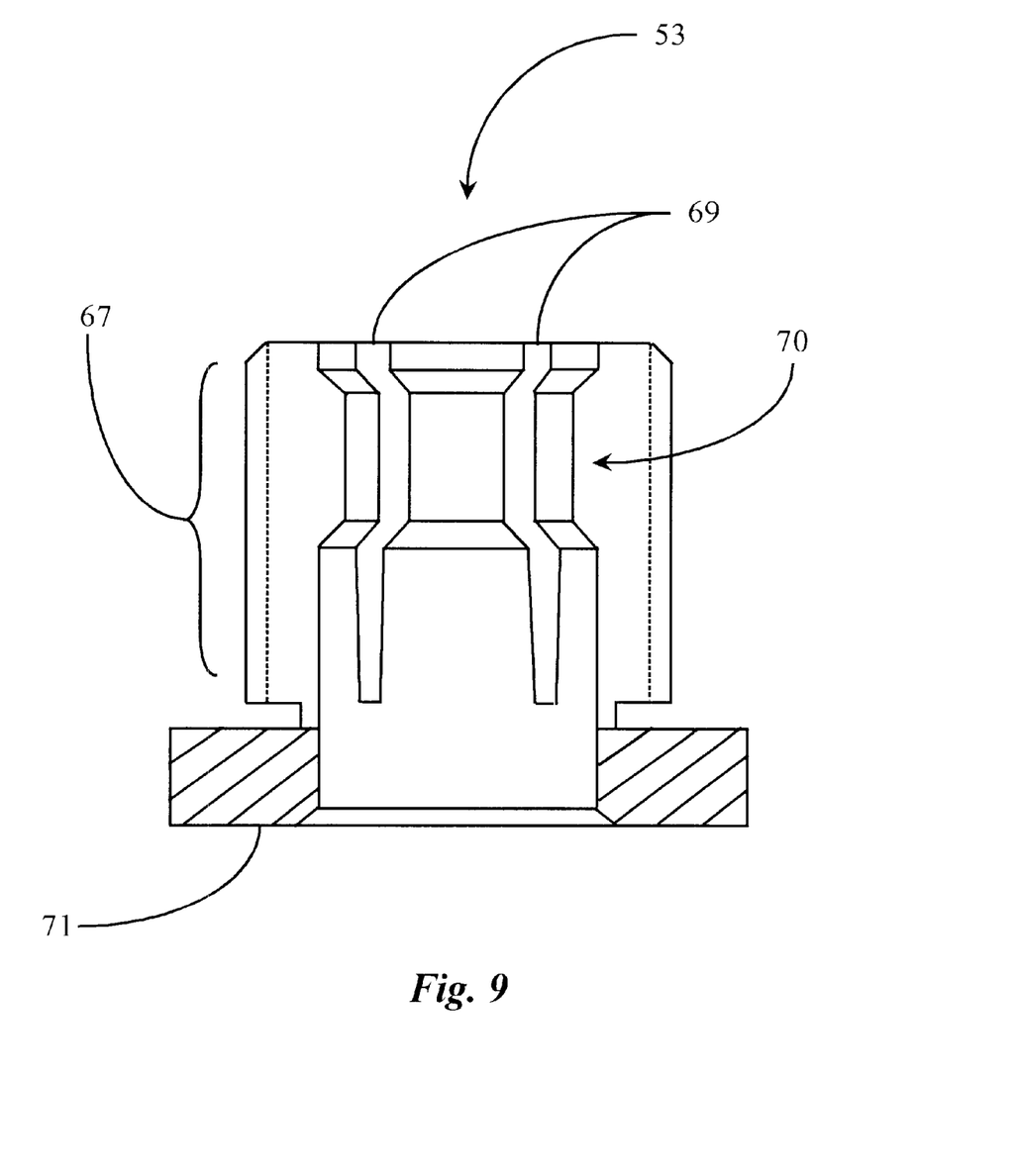
FIG. 9 is a partial section view of a threaded collar according to an embodiment of the present invention.

FIG. 9 is a half-section view of split-thread collar 53 according to an embodiment of the present invention. Collar 53 has a hex-head 71 to enable tightening and loosening by appropriate tools adapted for the purpose. A threaded portion 67 is provided on the outer surface of collar 53 for threading into elbow weldment 55 of FIG. 8 as previously described.

A plurality of vertical saw-cuts 69 are provided through the body portion of collar 53 with each cut-plane intersecting the vertical centerline of collar 53. In this example, three cuts 69 are provided to produce six land areas equally spaced at approximately 60-degree intervals around the circumference. In other embodiments, there may be more or fewer cuts. Each saw cut terminates at a point in the body of collar 53 above hex-head 71. The actual depth of saw-cuts 69 will depend to some extent on the amount of flexibility desired for collar 53.

A ridge feature 70 formed on the inside surface of collar 53 is adapted to seat into the previously-described groove provided around post 39 thus retaining collar 53 to post 39. In a preferred embodiment the shape of the groove and ridge are trapezoidal, with angled sides, which provides significant engagement in assembly.

It will be apparent to one with skill in the art that a plasma generating assembly such as assembly 36 may be used with differing diameter diffusers and chambers as long as ringed components such as insulator ring 43 (FIG. 1) and electrode 37 (FIG. 1) are provided to be of correct diameter. All other components are interchangeable.

It will also be apparent to one with skill in the art that the method and apparatus of the present invention may be used in CVD, PECVD, or other variant process systems that may use a diffuser such as diffuser 9 and a suitable process chamber. In one embodiment, the apparatus of the present invention may be constructed and designed to assume a rectangular or other geometric profile for use with geometrically variant chambers common in some types of deposition systems. In this case a diffuser such as diffuser 9 of FIG. 1 would also assume a rectangular or other geometric profile instead of a circular one. There are many possibilities. Therefore, the method and apparatus of the present invention should be afforded the broadest scope. The spirit and scope of the present invention is limited only by the claims that follow.

What is claimed is:

1. An RF electrode module for use with a gas-diffuser showerhead device in a CVD chamber, comprising:

an electrically-conductive electrode ring with a ring inside diameter (R-ID) and a ring outside diameter (R-OD), the ring having an upwardly-extending power post, and an internal water-cooling channel open to an upwardly extending inlet tube and an upwardly-extending outlet tube, all posts and tubes parallel to a central axis of the ring; and an electrical-insulator ring having an insulator outside diameter (I-OD) equal to or greater than the R-OD and an insulator inside diameter (I-ID) equal to or smaller than the R-ID, and through-openings extending in the direction of the central axis of the ring and spaced such that the power post, inlet post, and outlet post extend through the through-openings in the insulator ring, the I-ID sized to engage a shoulder diameter of the gas diffuser showerhead device;

characterized in that the power post comprises a threaded region along the outside major diameter adjacent an end away from the electrode ring, the threaded region for connecting a power source, and further characterized in that the inlet tube and the outlet tube each comprise a groove in the outer tube diameter adjacent an end away from the electrode ring, the grooves for matching flexible extensions of split, threaded nuts capable of slipping over the end of the tubes such that the flexible extensions engage the grooves in the tubes.

2. The electrode module of claim 1 wherein the electrode module has an angled face from the R-OD to the R-ID, facing toward the central axis of the electrode ring.

3. The electrode module of claim 2 wherein the electrical-insulator ring has a groove enclosing the electrode ring leaving only the angled face exposed.

4. The electrode module of claim 1 further comprising a threaded nut assembled to each inlet and outlet tube, each threaded nut comprising:

a substantially cylindrical body having an outside major diameter and a through-bore along a central axis of the body, the through-bore defining an inside major diameter, the body having a length in the direction of the central axis, a tool interface at a first end of the body, the tool interface shaped to engage a tool for exerting a torque around the central axis;

a threaded region along the outside major diameter from a second end of the body opposite the first end and extending from the second end along a substantial portion of the outside major diameter toward the tool interface;

an internal ridge in the substantially cylindrical body extending from the inside major diameter toward the central axis for a portion of the length within the threaded region; and three or more flexible portions formed by cuts through the substantially cylindrical body from the second end extending for a substantial portion of the threaded region;

wherein the threaded nut on each inlet and outlet tube engages the groove in the outer tube diameter by the internal ridge in the substantially cylindrical body of the threaded nut.

* * * * *